US009327987B2

(12) United States Patent
Mohsseni-Ala et al.

(10) Patent No.: US 9,327,987 B2
(45) Date of Patent: May 3, 2016

(54) PROCESS FOR REMOVING NONMETALLIC IMPURITIES FROM METALLURGICAL SILICON

(75) Inventors: Seyed-Javad Mohsseni-Ala, Bitterfeld-Wolfen (DE); Christian Bauch, Bitterfeld-Wolfen (DE); Rumen Deltschew, Leipzig (DE); Thoralf Gebel, Dresden (DE); Gerd Lippold, Leipzig (DE); Matthias Heuer, Berlin (DE); Fritz Kirscht, Berlin (DE); Kamel Ounadjela, Belamont, CA (US)

(73) Assignee: SPAWNT PRIVATE S.A.R.L., Luxembourg (LU)

( * ) Notice: Subject to any disclaimer, the term of this patent is extended or adjusted under 35 U.S.C. 154(b) by 859 days.

(21) Appl. No.: 13/057,084

(22) PCT Filed: Jul. 29, 2009
(Under 37 CFR 1.47)

(86) PCT No.: PCT/DE2009/001059
§ 371 (c)(1),
(2), (4) Date: Jan. 15, 2013

(87) PCT Pub. No.: WO2010/012273
PCT Pub. Date: Feb. 4, 2010

(65) Prior Publication Data
US 2013/0171052 A1 Jul. 4, 2013

(30) Foreign Application Priority Data
Aug. 1, 2008 (DE) .................. 10 2008 036 143

(51) Int. Cl.
| C01B 33/02 | (2006.01) |
| C01B 33/037 | (2006.01) |
| C30B 29/06 | (2006.01) |
| C30B 11/00 | (2006.01) |
| C30B 15/00 | (2006.01) |
| C30B 15/34 | (2006.01) |

(52) U.S. Cl.
CPC .............. *C01B 33/037* (2013.01); *C30B 11/00* (2013.01); *C30B 15/00* (2013.01); *C30B 15/34* (2013.01); *C30B 29/06* (2013.01)

(58) Field of Classification Search
None
See application file for complete search history.

(56) References Cited

U.S. PATENT DOCUMENTS

| 2,709,176 A | 5/1955 | Bluestein et al. |
| 4,200,621 A * | 4/1980 | Liaw et al. .............. 117/21 |
| 4,242,307 A | 12/1980 | Fally |
| 4,298,423 A | 11/1981 | Lindmayer |
| 4,312,849 A | 1/1982 | Kramer |
| 4,374,182 A | 2/1983 | Gaul et al. |
| 4,661,335 A | 4/1987 | Boudot et al. |
| 4,837,376 A * | 6/1989 | Schwirtlich et al. .......... 423/348 |
| 5,030,536 A | 7/1991 | Pai et al. |
| 5,034,208 A | 7/1991 | Ikeda et al. |
| 5,604,133 A | 2/1997 | Aoike |
| 5,772,728 A | 6/1998 | Eikeland et al. |
| 2007/0266826 A1 | 11/2007 | Sanjurjo et al. |
| 2008/0241045 A1 | 10/2008 | Ito |
| 2009/0127093 A1 | 5/2009 | Auner |
| 2009/0169457 A1 | 7/2009 | Auner et al. |

FOREIGN PATENT DOCUMENTS

| AT | 200106 | 10/1958 |
| CA | 1336354 | 7/1995 |
| CA | 2726003 | 12/2009 |
| DE | 2623413 | 12/1977 |
| DE | 2929089 | 1/1980 |
| DE | 3504723 | 8/1986 |
| DE | 19735378 | 2/1999 |
| DE | 19859288 | 6/2000 |
| DE | 10057481 | 5/2002 |
| DE | 10060469 | 7/2002 |
| DE | 10124848 | 11/2002 |
| DE | 60124246 | 5/2007 |
| DE | 102006034061 | 1/2008 |
| DE | 102008025264 | 3/2009 |
| DE | 102008025263 | 12/2009 |
| EP | 0007063 | 1/1980 |
| EP | 0264045 | 4/1988 |
| EP | 0264722 | 4/1988 |
| EP | 0282037 | 9/1988 |
| EP | 0 304 714 | 3/1989 |
| EP | 0304714 | 3/1989 |
| EP | 0699625 | 3/1996 |
| GB | 702349 | 1/1954 |

(Continued)

OTHER PUBLICATIONS

English Translation of Sep. 4, 2013 Office Action for the Japanese Related Application No. JP2011/0510825.
Herzog, U., et al., "Heterosubstituted Polysilanes", Anerican Chem., Soc., Macromolecules, vol. 32, No. 7, Feb. 1999, pp. 2210-2214.
Hollemann A. F., Wiberg E.N.: "Halogenverbindungen des Siliciums 26, 35, 37" (translation), Lehrbuch der anorganischen Chemie, vol. 102, p. 944.
Fritz, G. et al.: "Gewinnung ringformiger chlorierter Silicium-methylen-Verbindungen (Cyclocarbosilane) aus CH3SiCl3, (CH3)2SiCl2 und (CH3)3SiCl", Z. anorg. allg. Chem. 299, Band 302, 1959, pp. 61-80.

(Continued)

*Primary Examiner* — Melvin C Mayes
*Assistant Examiner* — Michael Forrest
(74) *Attorney, Agent, or Firm* — Enshan Hong; Kent H. Cheng; VLP Law Group LLP

(57) ABSTRACT

The invention describes a process for removing nonmetallic impurities from metallurgical silicon. A melt is produced from metallurgical silicon and halide-containing silicon. As a result, the impurities are sublimed out and removed from the melt in the form of nonmetal halides. Compared with the known process, in which gaseous halogen is blown through an Si melt, the novel process can be carried out in a particularly simple and efficient manner.

21 Claims, No Drawings

(56) References Cited

FOREIGN PATENT DOCUMENTS

| | | |
|---|---|---|
| GB | 2079736 | 1/1982 |
| JP | 62-289224 | 12/1987 |
| JP | 63-103811 A | 5/1988 |
| JP | 63-225511 | 9/1988 |
| JP | 01197309 | 8/1989 |
| JP | 01197309 | 9/1989 |
| JP | 2005-255417 A | 9/2005 |
| JP | 2006282498 A | 10/2006 |
| WO | 0037719 | 6/2000 |
| WO | 03078319 A1 | 9/2003 |
| WO | 2006/062660 | 6/2006 |
| WO | WO 2006/125425 | 11/2006 |
| WO | WO 2007/127482 | 11/2007 |
| WO | 2008-035799 A1 | 3/2008 |
| WO | 2008-062204 A1 | 5/2008 |
| WO | WO 2009/143825 | 12/2009 |

OTHER PUBLICATIONS

English Translation of Dec. 17, 2013 Office Action for the Japanese Related Application No. JP2011/520323.

Hollemann Wiberg, *Halogen Compounds of Silicon*, XV. Carbon group (Tetrels).

Überblick, Halogenverbindungen des Siliciums, XV Die Kohlenstoffgruppe, p. 944.

Giraldo et al., "Synthesis and Characterization of Halogenated Amorphous Silicon via a Novel Glow Discharge Process", Chem Mater. 1998, 10, 366-371.

\* cited by examiner

PROCESS FOR REMOVING NONMETALLIC IMPURITIES FROM METALLURGICAL SILICON

CROSS REFERENCE TO PRIORITY APPLICATION

This is a U.S. national stage of application No. PCT/DE2009/001059, filed on Jul. 29, 2009. Priority is claimed on German Application No. 10 2008 036 143.7, filed Aug. 1, 2008, the content of which is incorporated here by reference.

BACKGROUND OF THE INVENTION

The present invention relates to a process for removing nonmetallic impurities from metallurgical silicon.

The term "metallurgical silicon" used in this document is intended to encompass all Si quality grades, i.e. metallurgical silicon, UMG (upgraded metallurgical-grade) silicon, solar-grade silicon and electronic-grade silicon, and also the associated raw silicon and the associated pre-products of the Si quality grades and of the corresponding raw silicon. The term "metallurgical silicon" is therefore to be interpreted in the broadest sense.

Metallurgical silicon is purified by means of different technologies in order to obtain raw silicon which is suitable for the production of solar cells. Metallurgical silicon treated in this way is referred to as UMG (upgraded metallurgical-grade) silicon. UMG raw silicon often still has relatively high concentrations of impurities, which are undesirable and have to be removed in order to be able to produce high-quality solar cells. German patent application 10 2008 025 263.8 describes a process for purifying metallurgical silicon, in which halide-containing silicon is added to metallurgical silicon, a melt is produced from the substances and the impurities are sublimated out of the melt and removed in the form of metal halides. This process therefore relates to the removal of metals from the metallurgical silicon. The process is also suitable for further purifying UMG raw silicon. Metals removed include metalloids, alkaline earth metals, etc. It has also been observed that very good results can be obtained with this process for pre-products of UMG raw silicon. Pre-products of this type are likewise referred to as UMG raw silicon in the following.

With respect to the removal of nonmetallic impurities from silicon, a process for removing phosphorus impurities is known from U.S. Pat. No. 4,312,849, for example. In this case, a silicon melt is produced, and a gas containing a chlorine source is blown through said melt.

In another known process for removing phosphorus from a silicon melt, the melt is subjected to a vacuum treatment. Yet another known process relates to the simultaneous removal of boron and phosphorus by means of a plasma purification process.

The removal of nonmetallic impurities from metallurgical silicon with the aid of gaseous chlorine sources is therefore already known. In this case, gas mixtures containing chlorine gas or chlorine are introduced into the Si melt. The implementation of such technology is very complex, however, since the chlorine has to be introduced directly into the melt, which is generally effected by means of small tubes or special nozzles. Therefore, a homogeneous distribution of the chlorine over the entire melt is only possible to a limited extent. Moreover, the apparatuses for introducing the chlorine into the melt can adversely affect the melt itself, that is, impurities originating from the apparatuses for introducing gas can occur, for example.

SUMMARY OF THE INVENTION

The present invention is based on the object of providing a process for removing nonmetallic impurities from metallurgical silicon, which can be carried out particularly easily and effectively.

This object is solved according to the invention in a first variant by a process for removing nonmetallic impurities from metallurgical silicon, comprising the following steps:

mixing halide-containing silicon with the metallurgical silicon to be purified;

melting the mixture and thereby sublimating out the impurities and removing the same from the melt in the form of nonmetal halides.

The object mentioned above is solved in a second variant of the invention by a process for removing nonmetallic impurities from metallurgical silicon, comprising the following steps:

melting the metallurgical silicon to be purified;

introducing halide-containing silicon into the melt and thereby sublimating out the nonmetallic impurities and removing the same from the melt in the form of nonmetal halides.

DETAILED DESCRIPTION OF THE PRESENTLY PREFERRED EMBODIMENTS

In the process according to the invention, therefore, rather than using a gaseous chlorine source for removing the nonmetallic impurities as it is the case in the prior art, use is made of solid halide-containing silicon. The halide-containing silicon used according to the invention is preferably EG (electronic-grade) silicon. In the first variant of the process according to the invention, the solid halide-containing silicon is mixed with the metallurgical silicon to be purified, after which a melt is produced. In the second variant, the halide-containing silicon is introduced directly into a melt of the metallurgical silicon to be purified.

It has surprisingly been ascertained that very good purification results can also be achieved with regard to nonmetallic impurities with the halide-containing silicon used according to the invention. This relates, in particular, to the removal of dopants, and therefore the process according to the invention is used with particular preference for removing boron and/or phosphorus. The process according to the invention therefore makes it possible to control the boron and/or phosphorus content of metallurgical silicon in a particularly easy and efficient manner, and therefore it is thereby possible to use the process according to the invention with particular preference for controlling and/or setting the resistivity of metallurgical silicon. The resistivity is of particularly great importance with regard to a controlled, high solar cell efficiency.

In the process according to the invention, halogen-containing compounds are released and distributed homogeneously in the melt by the melting of the halogen-containing silicon added. Due to the halogen-containing compounds, the nonmetallic impurities are converted into volatile compounds (nonmetal halides) which emerge from the melt, and therefore the desired purification effect is thereby achieved.

In a further variant of the process according to the invention, the melt is replenished with halide-containing silicon. In this case, "melt" is taken to mean the melt consisting of the mixture of halide-containing silicon and silicon to be purified, or the melt consisting solely of silicon to be purified. In both cases, by means of the "replenishing" performed, the corresponding purification process can be set, for example readjusted or begun anew.

Yet another embodiment of the process according to the invention is distinguished by the fact that the melt is homogenized. This can be effected, for example, by means of agitation of the melt, in particular by crucible rotation, use of a stirrer, etc. However, the melt can also be homogenized simply by being allowed to stand for a sufficient time, such that suitable homogenization arises by convection in this case.

The halide-containing silicon used is preferably chloride-containing silicon.

The halide-containing silicon used can preferably be halide-containing silicon which contains halosilane fractions mixed with Si fractions. Such halosilanes ($Si_nX_{2n+2}$, where X denotes halogen and n denotes 1-10, preferably 1-3) are preferably present (physically) in the voids of chlorine-containing silicon grains, but can be directly bonded to silicon atoms (Si—X) by chemical bonds.

The corresponding halide content can be determined quantitatively by titration using silver nitrate (according to Mohr). IR-spectroscopic measurements (ATR technique, diamond single reflection) on chlorine-containing silicon show a signal at 1029 $cm^{-1}$. The intensity is dependent on the halide content and increases as the halide content increases.

The halide-containing silicon is used with preference with a halide content of 1 at. % to 50 at. %.

In order to achieve good mixing of the halide-containing silicon with the metallurgical silicon to be purified, preferably granular, in particular fine-grained, halogen-containing silicon is used. In this case, the grain size is expediently 50 μm to 20000 μm.

The halide-containing silicon preferably has a bulk density of 0.2 $g/cm^3$ to 1.5 $g/cm^3$.

The halide content is dependent on the grain size. The halide content increases as the grain size increases.

It has been found that good results can be achieved with regard to the purification of metallurgical silicon with the process according to the invention without complicated devices for introducing gas into the melt. Nonmetallic impurities, in particular boron and/or phosphorus, in particular in the form of chlorides, were able to be removed from the melt in a completely satisfactory manner by means of said process.

The purification process according to the invention can be used, in particular, in Si crystallization processes using UMG raw Si, for example in ingot casting processes or Bridgman processes, Czochralsky processes, EFG processes, string ribbon processes, RSG processes. In this case, the process according to the invention is used for purifying the Si melt from which the ingots (in the case of multicrystalline Si) or crystals (in the case of single-crystal Si) are produced. In the Bridgman process, multicrystalline ingots are produced by producing single-crystal regions with a diameter of up to a plurality of centimeters by means of controlled, directional solidification. In the EFG (Edge-defined Film Growth) process, an octagonal "tube" is pulled from the silicon melt. The resulting multicrystalline tube is sawn at the edges and processed to form wafers. In the string ribbon process, between two wires a ribbon is pulled from the silicon melt. In the RGS (Ribbon Growth on Substrate) process, a ribbon of silicon arises by a carrier material being moved under a crucible with liquid silicon. The Czochralsky process is a process for producing silicon single crystals in which a crystal is pulled from the silicon melt. Under pulling and rotational movements, a cylindrical silicon single crystal deposits on a crystallization seed.

In the process according to the invention, use is preferably made of a halide-containing silicon obtained by thermal decomposition of halogenated polysilane. WO 2006/125425 A1 discloses a process for producing silicon from halosilanes, in which, in a first step, the halosilane is converted into a halogenated polysilane with generation of a plasma discharge, said halogenated polysilane subsequently being decomposed in a second step with heating to form silicon. By way of example, the halide-containing silicon used according to the invention can be produced by such a process, wherein the silicon used according to the invention is intended to preferably have a targeted, relatively high halide content of 1 at. %-50 at. %. This silicon having a relatively high halide content is made possible by relative low temperatures and relatively high pressures during the thermal decomposition (pyrolysis). The silicon obtained by thermal decomposition of halogenated polysilane is obtained directly in granular form.

The granular, halide-containing silicon used according to the invention is preferably produced in such a way that the halogenated polysilane is thermally decomposed with continuous addition in a reactor. Preferably, in this case, the halogenated polysilane is introduced into the reactor dropwise. The desired, relatively high halide content is obtained by means of this continuous procedure. In this case, the thermal decomposition preferably takes place in a temperature range of 350° C.-1200° C., wherein the temperature for the decomposition of the halogenated polysilane is preferably less than 400° C. Furthermore, the thermal decomposition is preferably carried out at a pressure of $10^{-3}$ mbar to 300 mbar above atmospheric pressure, wherein pressures>100 mbar are preferred.

An inert gas atmosphere, in particular argon atmosphere, can be maintained in the reactor used for the thermal decomposition.

The setting of the desired halide content is possible by variation of a series of parameters, for example setting a desired time profile, temperature profile and pressure profile. As already mentioned, the halide-containing silicon is preferably obtained directly in granular form. This does not, of course, rule out the possibility of correspondingly modifying the obtained end product by means of further mechanical measures, such as mechanical comminution, screening, etc., in order to obtain desired material properties in specific regions.

A further process variant for setting the halide content of the halide-containing silicon used according to the invention concerns an aftertreatment of the silicon obtained. By way of example, the halide content can be reduced by baking. Thus, by way of example, the chloride content of a Specific silicon type (grain size 50 μm to 20000 μm, chloride content 15%) was reduced to 4% by baking to 1150° C. over four hours. By way of example, baking, baking under vacuum, comminution or screening shall be mentioned as suitable after-treatment.

The process according to the invention can be used, in particular, for removing nonmetallic impurities from pre-products of UMG silicon. By way of example, such pre-products concern UMG materials with reduced purification efforts, such that the cost of the overall process for producing "solar-grade" materials is reduced by using the process according to the invention. At the same time, the quality of the corresponding materials can be improved in a controlled manner, and therefore the overall result is that solar cells can be produced with higher efficiency with reduced overall costs.

EXEMPLARY EMBODIMENT

A mixture of 106.8 g UMG silicon and 106.5 g granular silicon, obtained by thermal decomposition of halogenated polysilane, having a grain size of about 800 pm and a halide content of about 30 at. % was produced. The mixture obtained was placed on an aluminum oxide crucible having a coating of $Si_3N_4$ and melted in a tubular furnace at a pressure of 1 atm and under an air atmosphere with a temperature gradient of 4.8° C./cm sample volume. The heating phase from 20° C. to 1510° C. lasted for 8 h. The melt was maintained at a temperature of 1510° C. for 2 h. Crystallization took place by lowering the temperature over the course of 10 h from 1510° C. to 1280° C., and this was followed by a cooling operation from 1280° C. to 20° C. over the course of 12 h.

A vertical section having a thickness of about 2 mm was produced from the ingot obtained. This was etched by chemical purification (in $HF/HNO_3$). GDMS and ICPMS measurements were then carried out on said sample. Here, it was possible to ascertain a significant reduction of the phosphorus and boron content compared to the starting product.

Finally, it should also be mentioned that the process described in German patent application 10 2008 025 263.8 and the present process are suitable for removing metallic and nonmetallic impurities from metallurgical silicon as per the definition given in the introduction, where these processes have a significantly better efficiency than the processes in which gaseous halogen is blown through an Si melt.

The purification effect which can be achieved thereby is significantly more pronounced compared to the use of a gaseous halogen source (chlorine source). Overall, particularly good purification results have been obtained with regard to the metals Na, Mg, Ca, Cr, Fe, Co, Ni, Cu, Mn, Mo, W, Al and Ti and with regard to the nonmetals P and B. The purification effect is particularly valuable with regard to Mo, W and Ti, which, owing to their slow diffusion into Si, cannot be removed retroactively, for example by gettering. The process described in German patent application 10 2008 025 263.8 can likewise be used, in particular, for removing metallic impurities from pre-products of UMG silicon.

The present process is suitable, in particular, for removing nonmetallic impurities from metallurgical silicon, pre-products of UMG raw silicon or UMG silicon. It is preferably used for controlling and/or setting the resistivity of UMG raw silicon or of ingots or crystals of UMG raw silicon or pre-products of UMG raw Si.

Furthermore, the present invention relates to metallurgical silicon (as per the definition given in the introduction) obtained by a process described above. In this case, the metallurgical silicon can be present in multicrystalline or single-crystal form. It is preferably used for producing solar cells or semiconductor devices. According to the invention, it is therefore possible to obtain improved Si materials from ingots (multicrystalline Si) and crystals (single-crystal Si).

The invention claimed is:

1. A process for removing nonmetallic impurities from metallurgical silicon, comprising:
   mixing solid halide-containing silicon with the metallurgical silicon to be purified; and
   melting the mixture and thereby sublimating out the impurities and removing the same from the melt in form of nonmetal halides.

2. A process for removing nonmetallic impurities from metallurgical silicon, comprising:
   melting the metallurgical silicon to be purified;
   introducing solid halide-containing silicon into the melt and thereby sublimating out the nonmetallic impurities and removing the same from the melt in form of nonmetal halides.

3. The process according to claim 1 wherein the melt is replenished with halide-containing silicon.

4. The process according to claim 1, wherein the nonmetallic impurities are dopants.

5. The process according to claim 1 wherein the nonmetallic impurities are boron and/or phosphorus.

6. The process according to claim 1, wherein the halide-containing silicon contains halosilane fractions mixed with Si fractions.

7. The process according to claim 1 wherein the halide-containing silicon contains halogen chemically bonded to Si atoms.

8. The process according to claim 1 wherein the halide-containing silicon has a halide content of 1% to 50%.

9. The process according to claim 1 wherein the halide-containing silicon is granular.

10. The process according to claim 9 wherein the halide-containing silicon has a bulk density of 0.2 $g/cm^3$ to 1.5 $g/cm^3$.

11. The process according to claim 9 wherein the halide-containing silicon has a grain size of 50 μm to 20000 μm.

12. The process according to claim 1 wherein the halide content of the halide-containing silicon is set by means of aftertreatment.

13. The process according to claim 1 the halide-containing silicon is chloride-containing silicon.

14. The process according to claim 1 wherein the melt is homogenized.

15. The process according to claim 1 wherein the process is part of Si crystallization processes.

16. The process according to claim 1 wherein the halide-containing silicon is obtained by thermal decomposition of halogenated polysilane.

17. The process according to claim 1 wherein the nonmetallic impurities are from one or more pre-products of metallurgical silicon.

18. The process according to claim 1 wherein the nonmetallic impurities are from one or more pre-products of UMG raw silicon.

19. The process according to claim 1 wherein the nonmetallic impurities are from UMG raw silicon.

20. The process according to claim 1 wherein the metallurgical silicon to be purified is UMG raw silicon and a resistivity of UMG raw silicon is controlled and/or set.

21. The process according to claim 1 wherein the metallurgical silicon to be purified is ingots or crystals of UMG raw silicon or pre-products of UMG raw Si and a resistivity of ingots or crystal of UMG raw silicon or pre-products o UMG raw Si is controlled and/or set.

* * * * *